US011199587B2

(12) United States Patent
McQuellon et al.

(10) Patent No.: US 11,199,587 B2
(45) Date of Patent: Dec. 14, 2021

(54) SWINGING DOOR TEST SYSTEM

(71) Applicant: The United States of America, as represented by the Secretary of the Navy, Crane, IN (US)

(72) Inventors: Conner B. McQuellon, Bloomington, IN (US); Jeffrey D. Weddle, Trafalgar, IN (US); Julie D. Doerge, Ozark, IL (US); Reeve A. Arce, Bedford, IN (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 46 days.

(21) Appl. No.: 16/811,058

(22) Filed: Mar. 6, 2020

(65) Prior Publication Data

US 2020/0284840 A1 Sep. 10, 2020

Related U.S. Application Data

(60) Provisional application No. 62/814,572, filed on Mar. 6, 2019.

(51) Int. Cl.
*G01R 31/327* (2006.01)
*G01R 31/52* (2020.01)

(52) U.S. Cl.
CPC ......... *G01R 31/3277* (2013.01); *G01R 31/52* (2020.01)

(58) Field of Classification Search
CPC .................. G01R 31/3277–3278; G01R 31/52
See application file for complete search history.

(56) References Cited

U.S. PATENT DOCUMENTS

| | | | | |
|---|---|---|---|---|
| 3,973,357 A * | 8/1976 | Kluempers | ............. | E05F 3/225 49/13 |
| 4,409,552 A * | 10/1983 | Kompelien | .......... | H01H 47/002 324/415 |
| 4,763,111 A * | 8/1988 | Matsuo | .................... | G08B 3/10 200/61.62 |
| 5,942,867 A * | 8/1999 | Richmond | ................ | E05F 5/06 318/280 |
| 6,634,140 B1 * | 10/2003 | Sellman | .................. | E05F 15/41 49/340 |
| 9,273,505 B1 * | 3/2016 | Knittel | .................. | E05F 17/002 |
| 2005/0012504 A1 * | 1/2005 | Draggie | ............. | G01R 31/3278 324/418 |
| 2006/0010771 A1 * | 1/2006 | Houser | .................... | E05F 15/63 49/341 |
| 2009/0000198 A1 * | 1/2009 | Brown | .................... | E05F 15/53 49/139 |
| 2010/0192994 A1 * | 8/2010 | Christmann | ........ | A47L 15/4259 134/56 D |
| 2011/0094160 A1 * | 4/2011 | Houser | .................... | E05F 15/63 49/31 |
| 2012/0029701 A1 * | 2/2012 | Houser | .................. | E05F 15/63 700/275 |

(Continued)

*Primary Examiner* — Patrick Assouad
*Assistant Examiner* — Demetrius R Pretlow
(74) *Attorney, Agent, or Firm* — Naval Surface Warfare Center, Crane Division; Eric VanWiltenburg

(57) ABSTRACT

The present invention relates to a swinging door test system that can test the accuracy of a balanced magnetic switch installed on a mock door. An actuator opens and closes a door to change the magnetic switch state. Software implementation allows the actuator to be precisely controlled over many cycles to save time and effort.

5 Claims, 26 Drawing Sheets

(56) References Cited

U.S. PATENT DOCUMENTS

| | | | |
|---|---|---|---|
| 2013/0049382 A1* | 2/2013 | Day | E05B 17/002 292/251.5 |
| 2014/0002092 A1* | 1/2014 | Kodama | G01R 31/3278 324/418 |
| 2015/0014192 A1* | 1/2015 | Gilmore | G08B 13/08 206/216 |
| 2015/0191955 A1* | 7/2015 | Dudley | E05F 5/08 49/333 |
| 2016/0003922 A1* | 1/2016 | Smith | E05B 43/005 324/207.13 |
| 2016/0024831 A1* | 1/2016 | Houser | E05F 15/60 49/29 |
| 2016/0179089 A1* | 6/2016 | Stratmann | E05F 15/70 700/231 |
| 2017/0138762 A1* | 5/2017 | Jiang | H04Q 9/00 |
| 2017/0159344 A1* | 6/2017 | Langenberg | E05F 3/224 |
| 2017/0356238 A1* | 12/2017 | Gitman | G08B 13/08 |
| 2018/0094466 A1* | 4/2018 | Schneider | E05B 47/0038 |
| 2021/0172245 A1* | 6/2021 | Kincaid | E06B 7/28 |

* cited by examiner

Void AlarmPrint ()

From calling function →

```
{
unsigned int currentAve1 = calculatePotValue();
int d1 = map(currentAve1, lowSC, highSC, lowD, highD);
Serial.print("ALARM: ");
Serial.print(i);
Serial.print(" ");
Serial.print(d1);
Serial.println(" th/in");
}
```

Return to calling function →

FIG. 13

Void FailureToClose ()

From calling function →
{
  Serial.println ();
  Serial.print("Failure to SECURE closing on trial number # ');
  Serial.println (i);
  SecurePrint ();
  Serial.print('\n');
}
→ Return to calling function

Void SecurePrint ()

```
{
int currentValue13 = analogRead (valuePot);
Serial.print("SECURE: ");
Serial.print(i);
int d13 = map(currentValue13, lowSC, highSC, lowD, highD);
Serial.print (" " );
Serial.print (d13);
Serial.print(" ");
Serial.print ("th/in ");
}
```

From calling function →

Return to calling function →

*FIG. 15*

*Unsigned int calculatePotValue ()*

*From calling function* →

```
{
 int currentValue1 = analogRead (valuePot);
 delay (readdelay);
 int currentValue2 = analogRead (valuePot);
 delay (readdelay);
 int currentValue3 = analogRead (valuePot);
 delay (readdelay);
 int currentValue4 = analogRead (valuePot);
 delay (readdelay);
 int currentValue5 = analogRead (valuePot);
 delay (readdelay);
 int currentValue6 = analogRead (valuePot);
 delay (readdelay);
 int currentValue7 = analogRead (valuePot);
 delay (readdelay);
 int currentValue8 = analogRead (valuePot);
 delay (readdelay);
 int currentValue9 = analogRead (valuePot);
 delay (readdelay);
 int currentValue10 = analogRead (valuePot);

unsigned int currentSum1 = currentValue1 + currentValue2 + currentValue3 + currentValue4 + currentValue5 + currentValue6 + currentValue7 + currentValue8 + currentValue9 + currentValue10;
 unsigned int result = currentSum1 / 10;
 return result;
}
```

*Return to calling function* →

FIG. 17

SWINGING DOOR TEST SYSTEM

CROSS-REFERENCE TO RELATED APPLICATIONS

The present application claims priority to U.S. Provisional Patent Application Ser. No. 62/814,572, filed Mar. 6, 2019, entitled "Automated High Security and Reliability Balanced Alarm Sensor Testing, Swinging Door Actuation System, and Analysis Support System and Space Optimized Testing Structure," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,579) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF THE INVENTION

The present invention relates to a swinging door test system for testing magnetic switches.

BACKGROUND AND SUMMARY OF THE INVENTION

The present invention relates to a swinging door test system that can test the accuracy of an installed magnetic switch. Magnetic switches can be used to detect whether a door or window is in an open or closed position by using a magnet to close a circuit. When the door or window opens to a certain distance, the magnetic field created by the magnet no long closes the circuit; opening the circuit triggers a secondary effect (e.g., activating an alarm). Magnetic switches can have different sensitivities based on the magnetic used or the switch itself. As such, there can be a wide amount of variation in the distance a door or window can open before triggering the secondary effect.

According to an illustrative embodiment of the present disclosure, a swinging door test system can be used to determine the sensitivity of a magnetic switch. An actuator opens and closes a swinging door at precise increments to determine the door displacement distance at which the magnetic switch opens.

According to a further illustrative embodiment of the present disclosure, controllers can be used to repeatedly cycle the opening and closing of the door. Exemplary software can control when the actuator moves and stops to quickly and accurately measure the door displacement distance at which the magnetic switch opens and verify the results without operator intervention.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which:

FIGS. 6-26 show an exemplary software implementation of a test system.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

Figure 1:
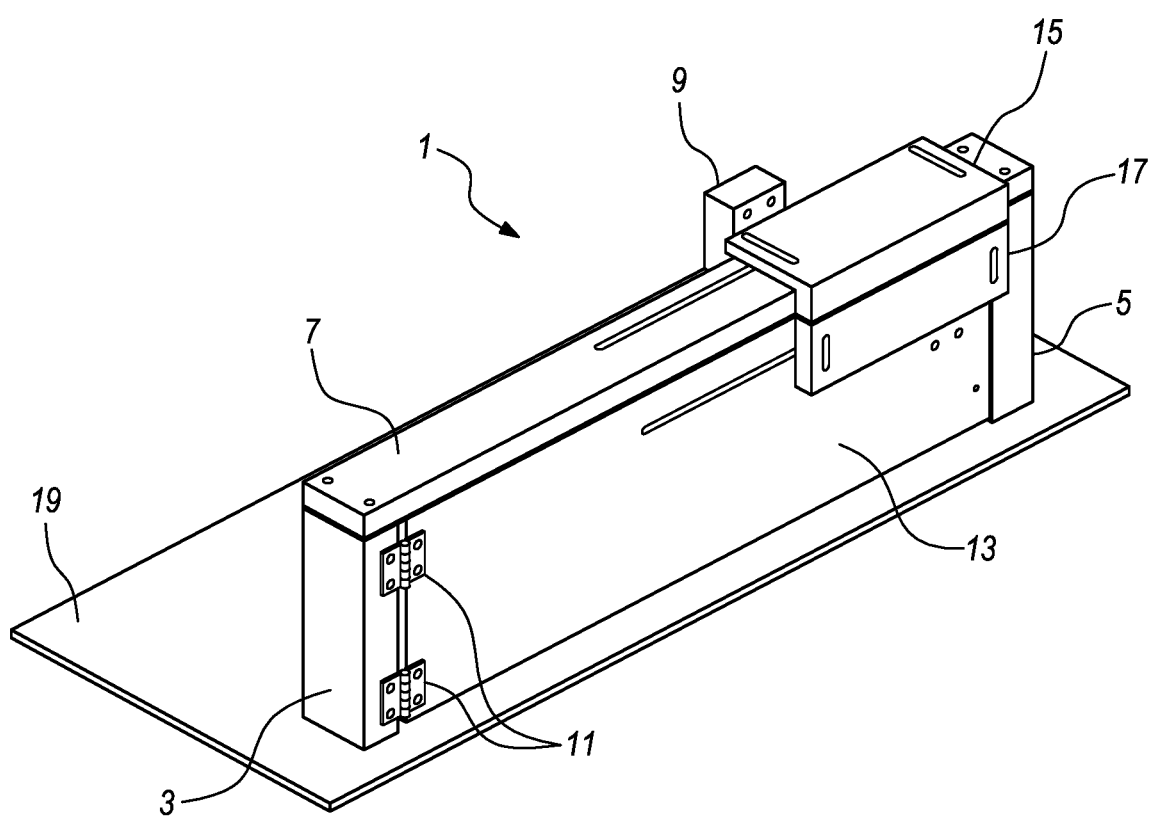
FIG. 1 shows an exemplary test system.

FIG. 1 shows an exemplary test system 1 for testing magnetic switches. Frame hinge support 3, frame non-hinge support 5, and frame top bar 7 couple together to form a doorframe section. Hinges 11 couple a door 13 to frame hinge support 3 to allow door 13 to rotate with respect to frame hinge support 3. An actuator (see FIG. 2) is coupled between actuator support 9 and door 13 such that extending or retracting the actuator opens or closes the door. Frame connecting plate 15 couples a magnetic switch (not shown) to the doorframe section. Door connecting plate couples a magnet (not shown) to the door 13. The magnetic switch has an on and off position controlled by the proximity of the door 13 (and thus the magnet) to the frame top bar 7 (and thus the magnetic switch).

Figure 2:
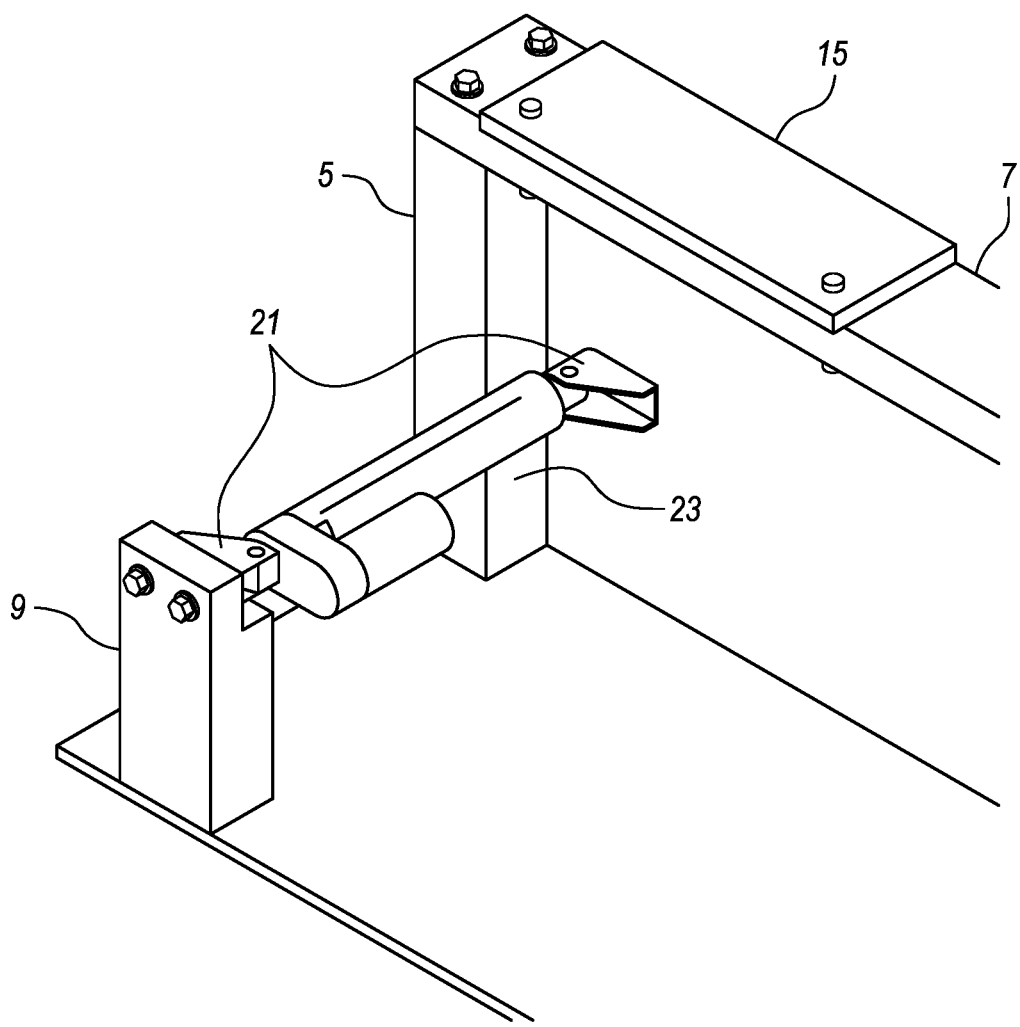
FIG. 2 shows a rear view of an exemplary test system.

FIG. 2 shows the backside of the exemplary test system 1 shown in FIG. 1. Actuator 23 is coupled between actuator support 9 and door (see FIG. 1) such that extending or retracting the actuator opens or closes the door. Actuator 23 can be coupled to the actuator support 9 and by actuator brackets 21 to allow rotation of the door as the door opens. FIGS. 1 and 2 show an embodiment where the actuator 23 extends to open door 13; in alternative embodiments, actuator 23 can retract to open door 13 by repositioning actuator support 9, actuator brackets 21, and actuator 23 to the wall-facing (when the door is fully open) side of the door.

Figure 3:
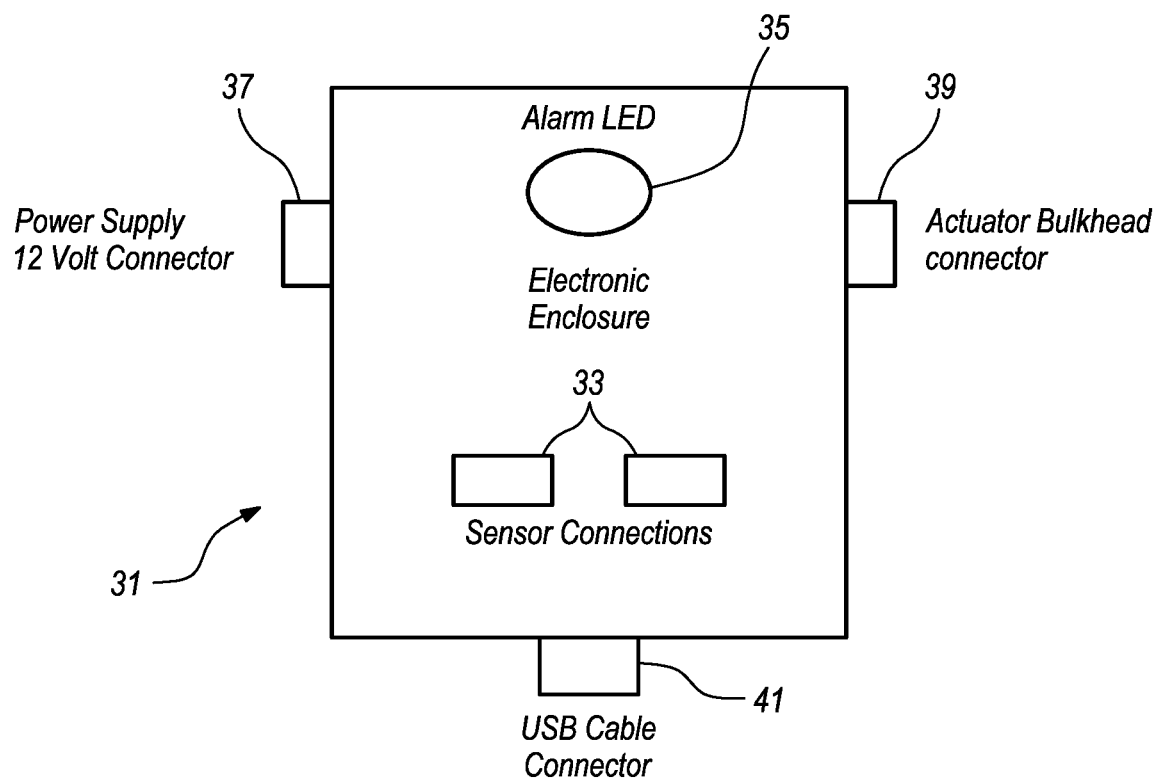
FIG. 3 shows an exemplary electronics unit.

FIG. 3 shows an exemplary electronics unit 31 for a test system. Electronics unit 31 includes sensor connections 33, alarm LED 35, power supply connector 37, actuator connector 39, and I/O connector 41.

Figure 4:
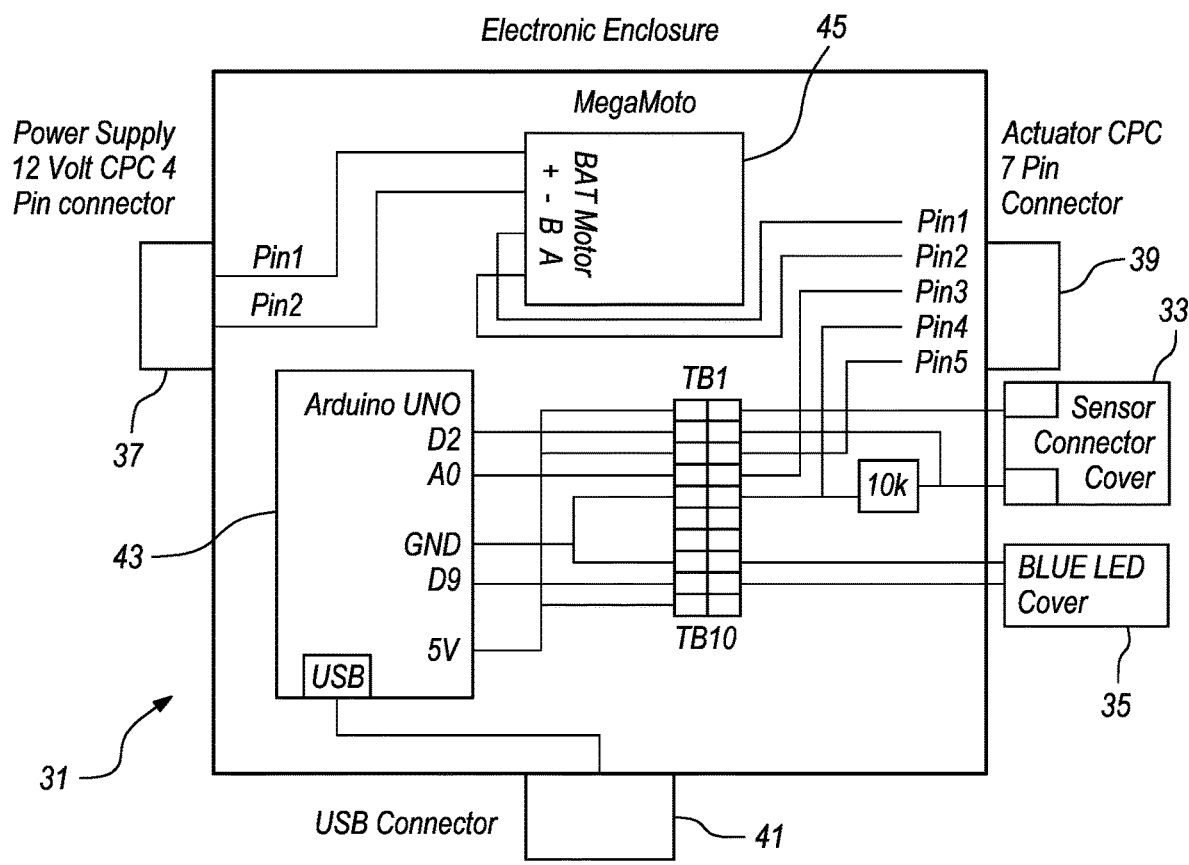
FIG. 4 shows an electronics diagram of an exemplary electronics unit.

FIG. 4 shows an electronics diagram for an exemplary electronics unit 31. Electronics unit 31 includes sensor connections 33, alarm LED 35, power supply connector 37, actuator connector 39, I/O connector 41, microcontroller 43, and actuator controller 45. Sensor connections 33 can be coupled to a potentiometer or other sensors for monitoring the operation of a magnetic switch being tested. Microcontroller 43 and actuator controller 45 are programmed to extend/retract an actuator on command through actuator connector 39. The controllers 43, 45 can be programmed to calculate the displacement the door has moved before triggering a magnetic switch. The distance the actuator extend/retracts corresponds to the displacement distance of the door. The potentiometer readings correlate to the actuator position, so the potentiometer values can be mapped to measured door displacement distance values. The magnetic switch can be configured to set off an alarm (e.g., alarm LED 35) when the magnetic switch is open. I/O connector 41 transmits instructions to microcontroller 43 and results to an external device (e.g. a laptop). Alarm LED 35 provides an operator easy visual indication of a test's progress without needing to review the recorded results.

Figure 5:
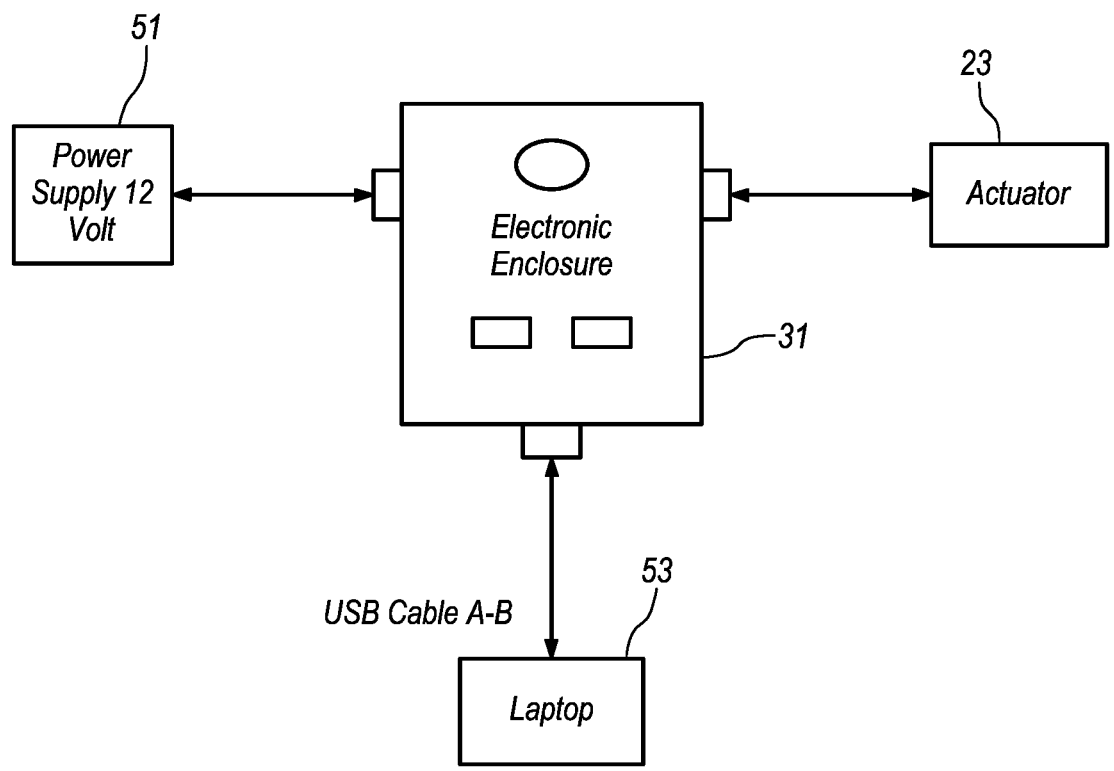
FIG. 5 shows an exemplary electronics system.

FIG. 5 shows an exemplary electronics unit 31 connected to a power supply 51, external device 53, and actuator 23.

Figure 6:
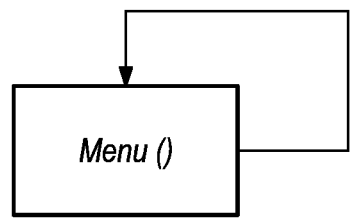

FIG. 6 shows an exemplary execution sequence of an actuator control program, referring to here as the loop function/routine. The Menu function is continuously called and used to execute instructions inputted by an operator to perform a stored set of instructions.

Figure 7:
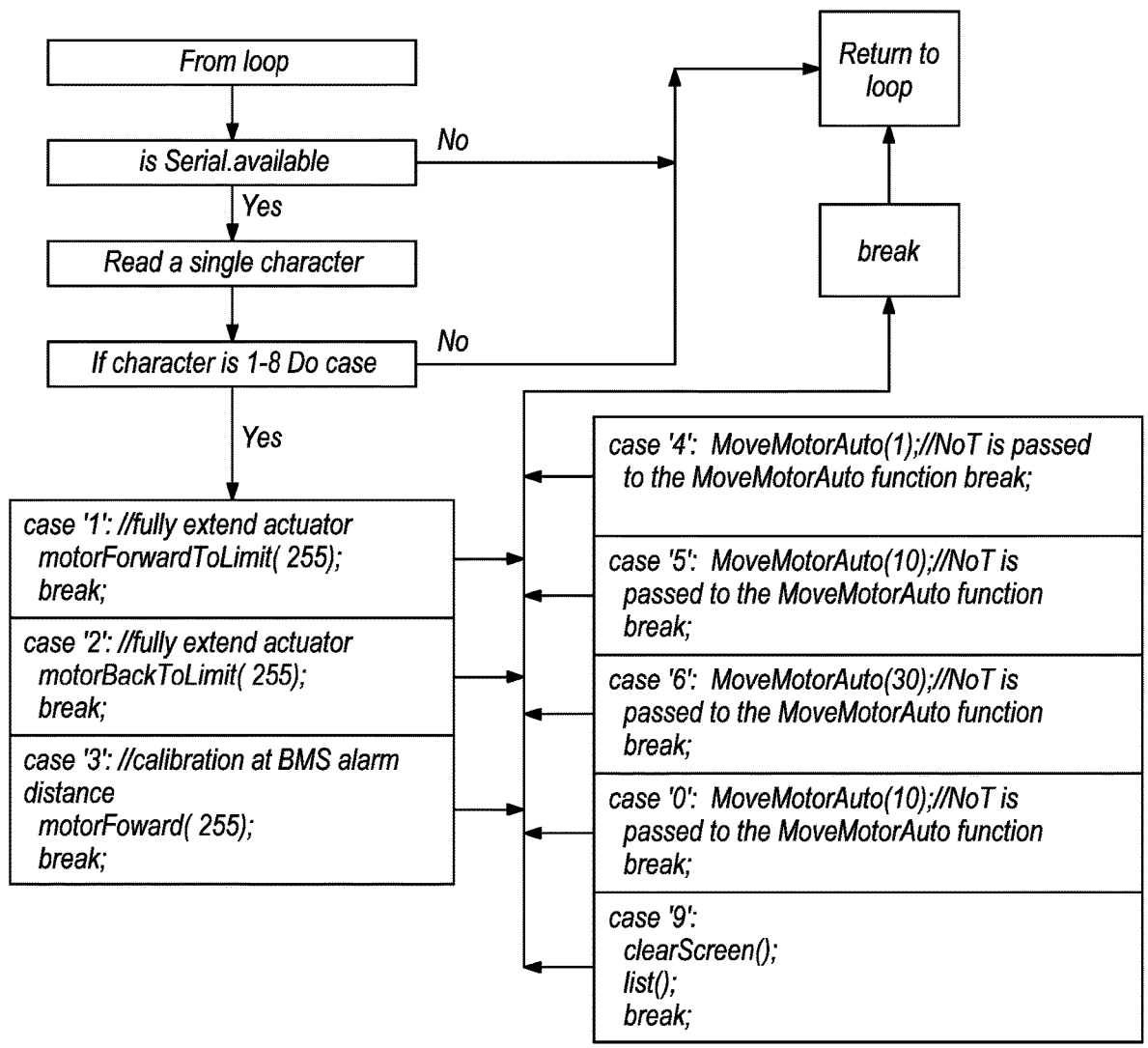

FIG. 7 shows an exemplary execution sequence of the Menu function. The Menu function looks for a valid user input to execute.

Figure 8:
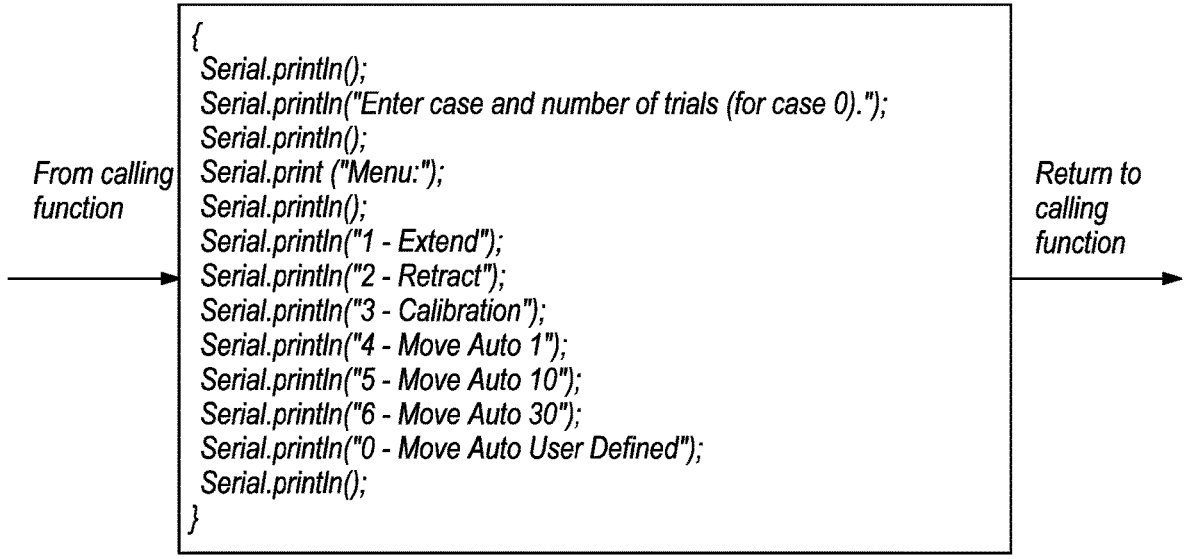

FIG. 8 shows an exemplary execution sequence of the list function. The list function prints a list of valid user inputs to the computer screen.

Figure 9:
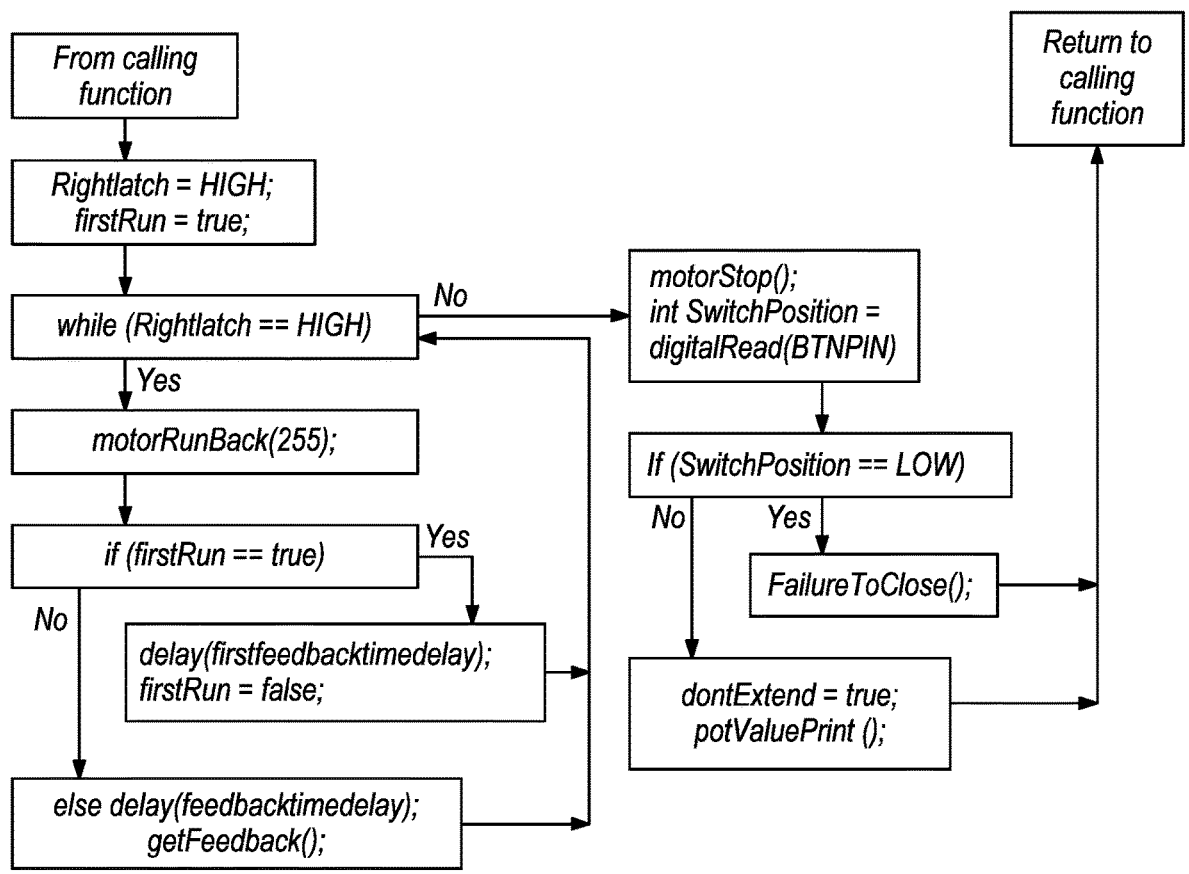

FIG. 9 shows an exemplary execution sequence of the motorBackToLimit function. The motorBackToLimit function cause the actuator to retract.

Figure 10:
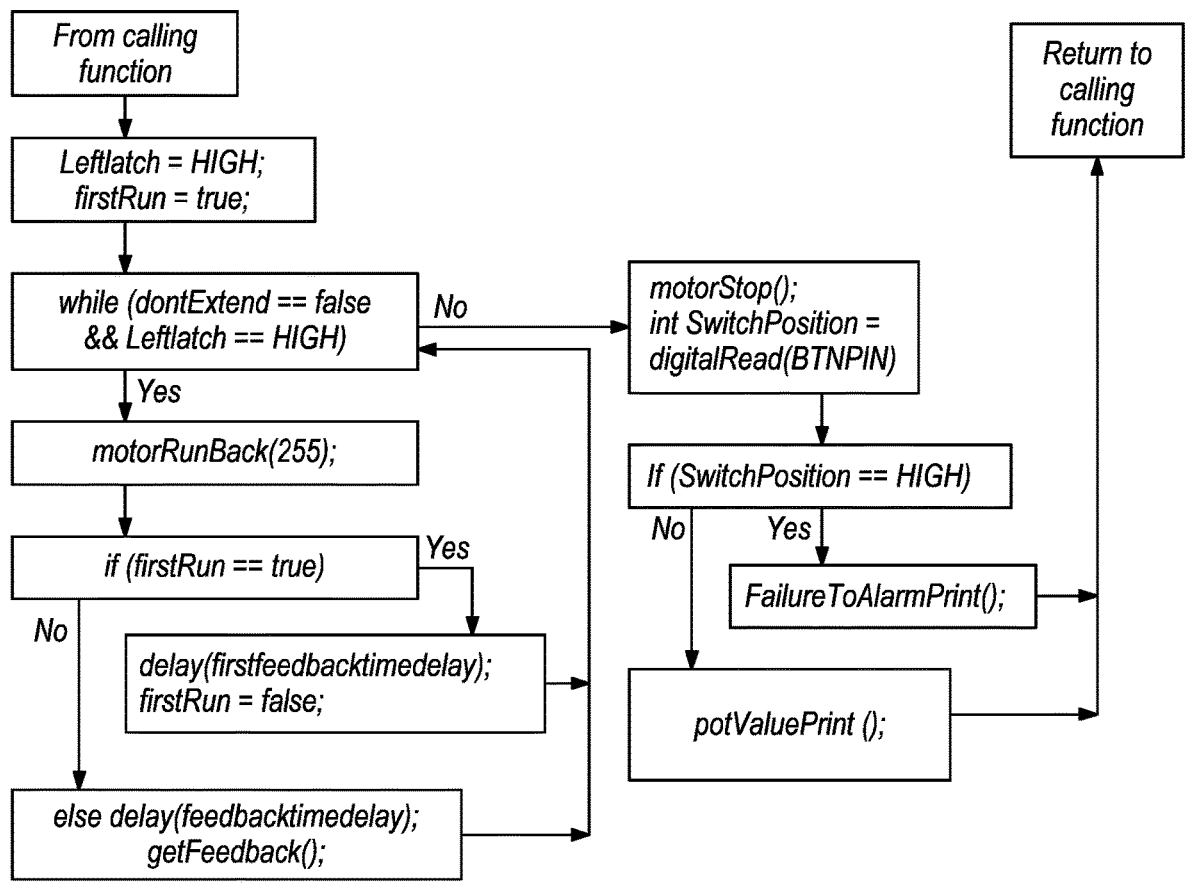

FIG. 10 shows an exemplary execution sequence of the motorForwardToLimit function. The motorForwardToLimit function causes the actuator to extend.

Figure 11:
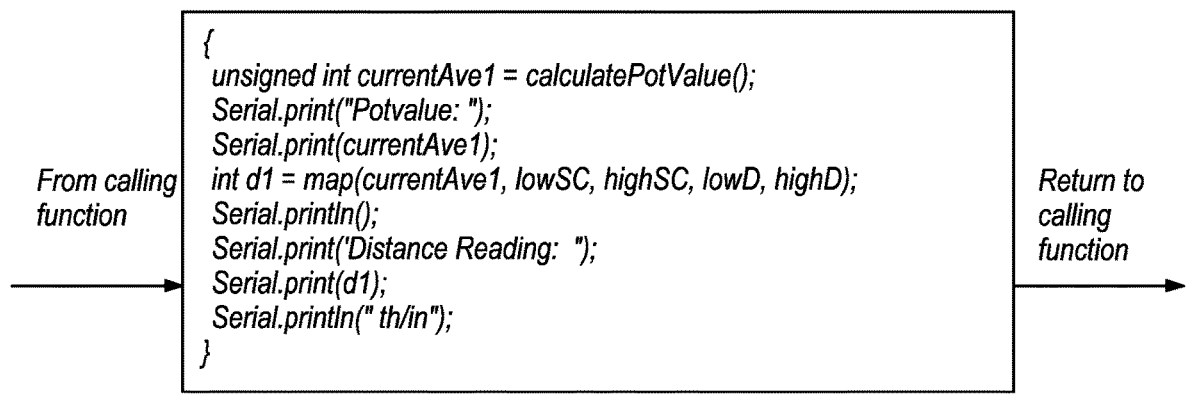

FIG. 11 shows an exemplary execution sequence of the potValuePrint function. The potValuePrint function will calculate the distance the actuator is displaced and print that value.

Figure 12:
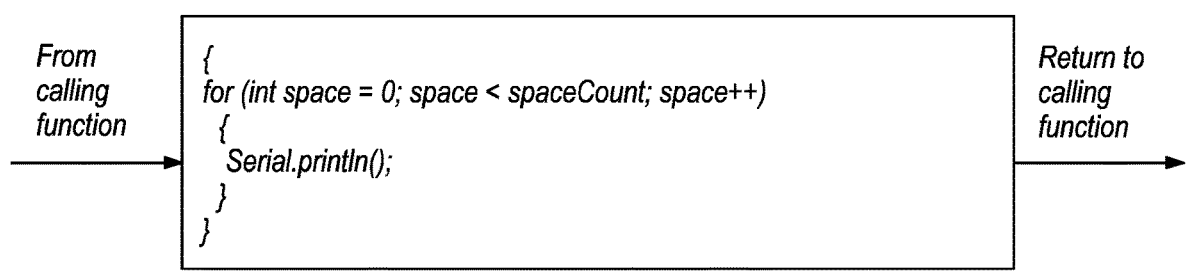

FIG. 12 shows an exemplary execution sequence of the clearScreen function. The clearScreen function causes the monitor screen to be cleared.

FIG. 13 shows an exemplary execution sequence of the AlarmPrint function. The AlarmPrint function will read the potentiometer value representative of the actuator position then map that value to voltage and distance and print alarm values to the display.

Figure 14:
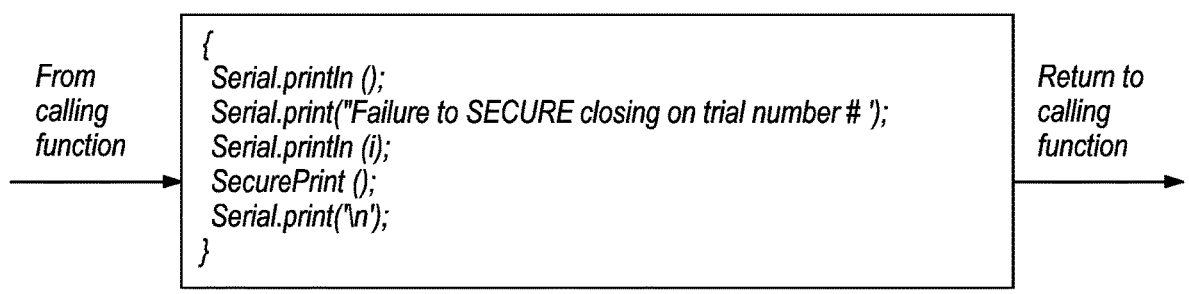

FIG. 14 shows an exemplary execution sequence of the FailureToClose function. The FailureToClose function alerts the operator that the switch did not reset when the door returned to a closed position.

FIG. 15 shows an exemplary execution sequence of the SecurePrint function. SecurePrint function will read the potentiometer value representative of the actuator position then map that value to voltage and distance and print secure values to the display.

Figure 16:
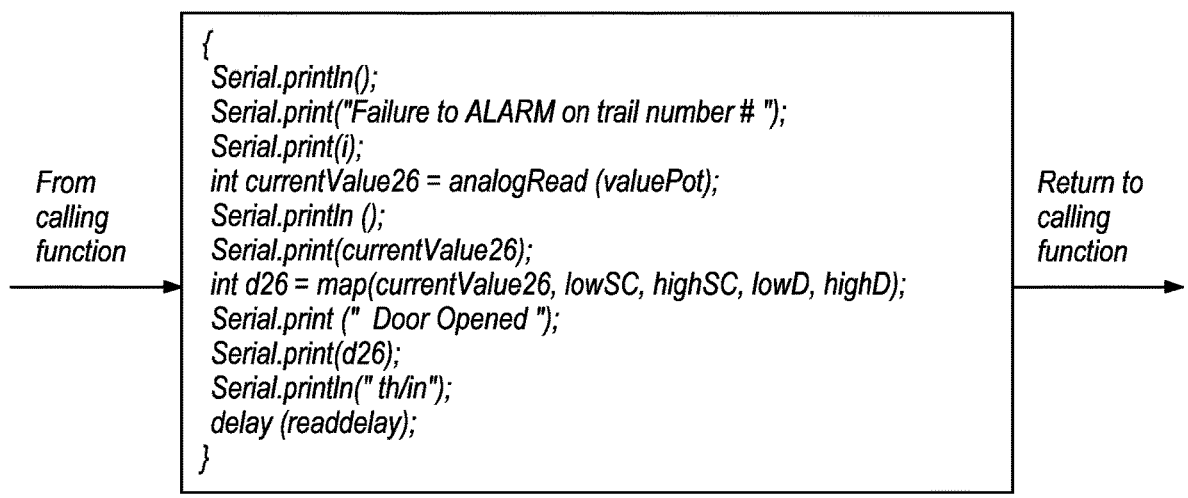

FIG. 16 shows the exemplary execution sequence of the FailureToAlarmPrint function. The FailureToAlarm function will alert the operator that the switch did not alarm when the actuator moved the door to an opened position.

FIG. 17 shows the exemplary execution sequence of the calculatePotValue function. The calculatePotValue function reads the potentiometer value 10 times and then return the average of the ten readings as the value that equates to the door displacement.

Figure 18:
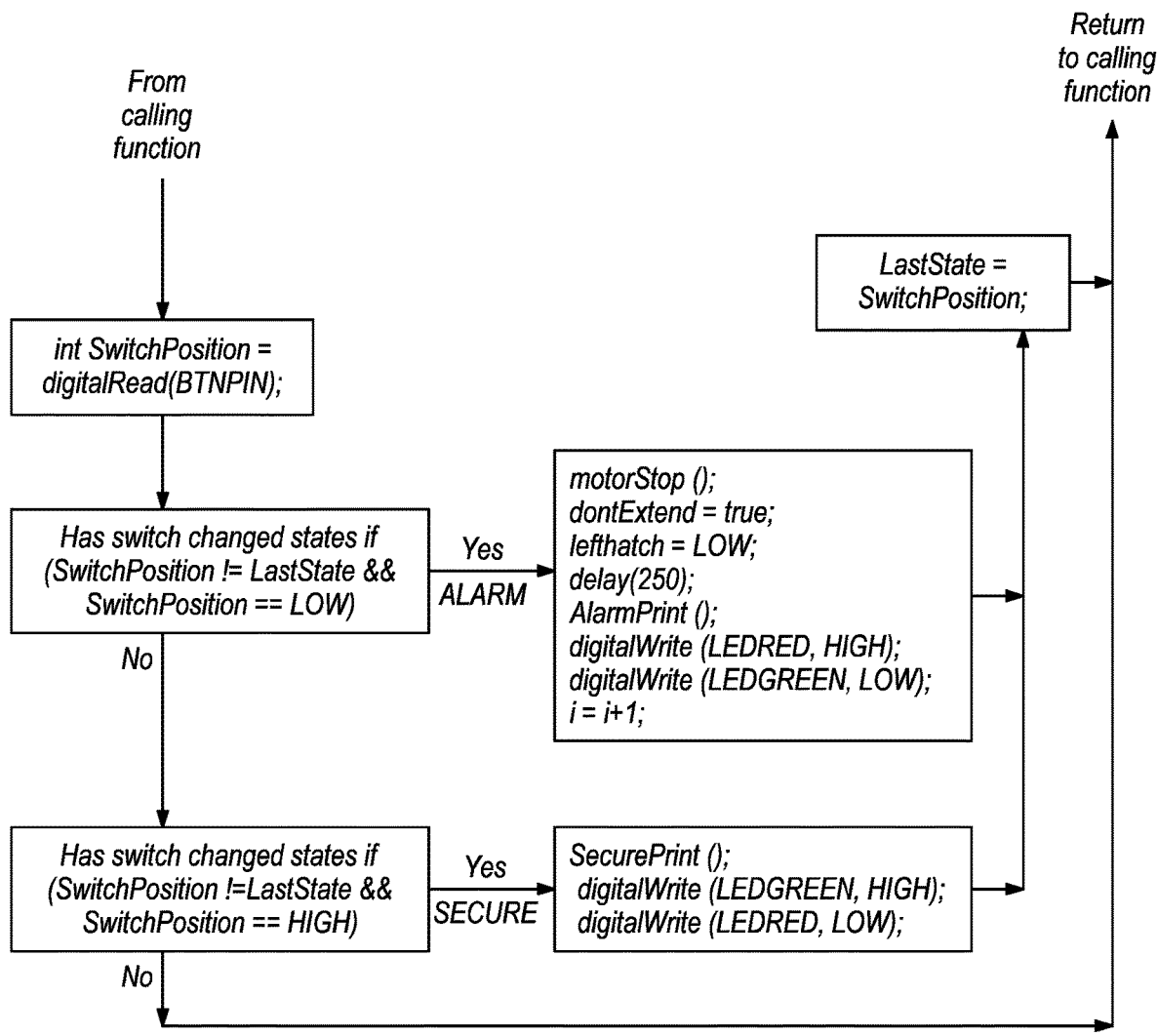

FIG. 18 shows the exemplary execution sequence of the BMS_Position function. The BMS_Position function monitors the position of the switch under test for a change in switch position. When the switch state changes the appropriate message is printed to the screen.

Figure 19:
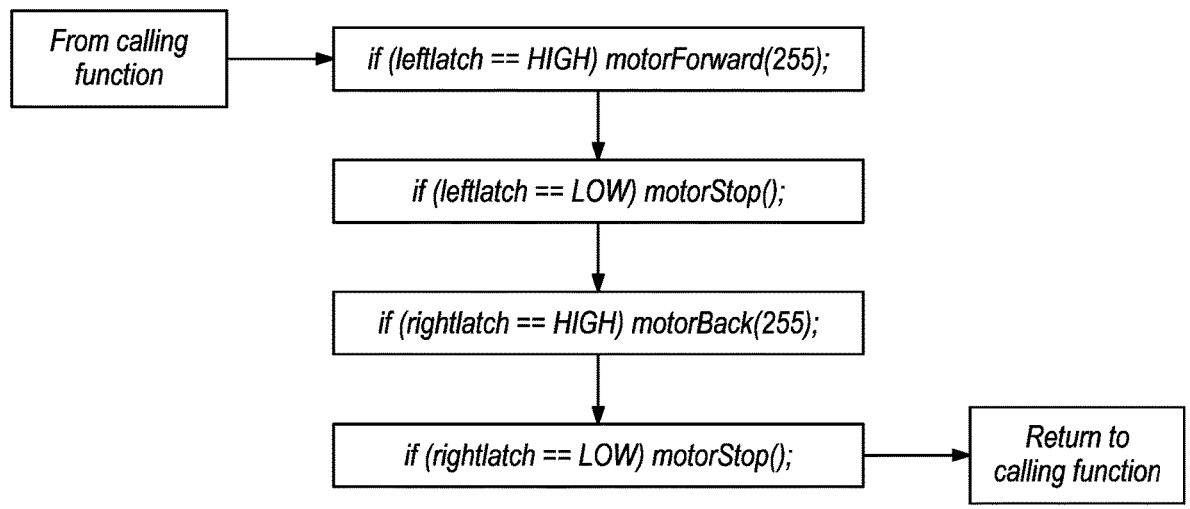

FIG. 19 shows the exemplary execution sequence of the moveMotor function. The moveMotor function is used to start and stop actuator movement.

Figure 20:
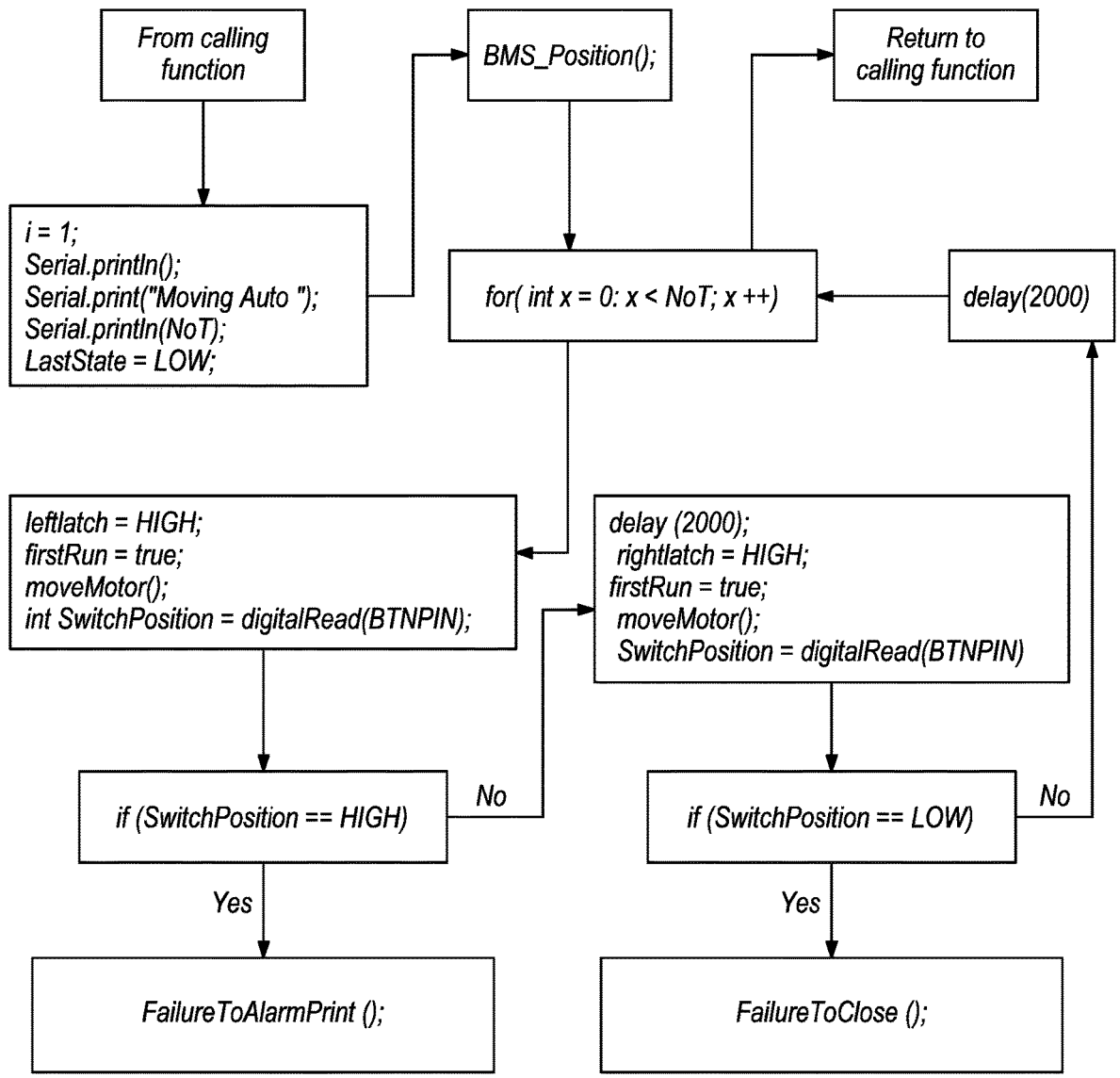

FIG. 20 shows the exemplary execution sequence of the MoveMotorAuto function. The MoveMotorAuto function is called when a set number of executions of the trails is requested by the operator.

Figure 21:
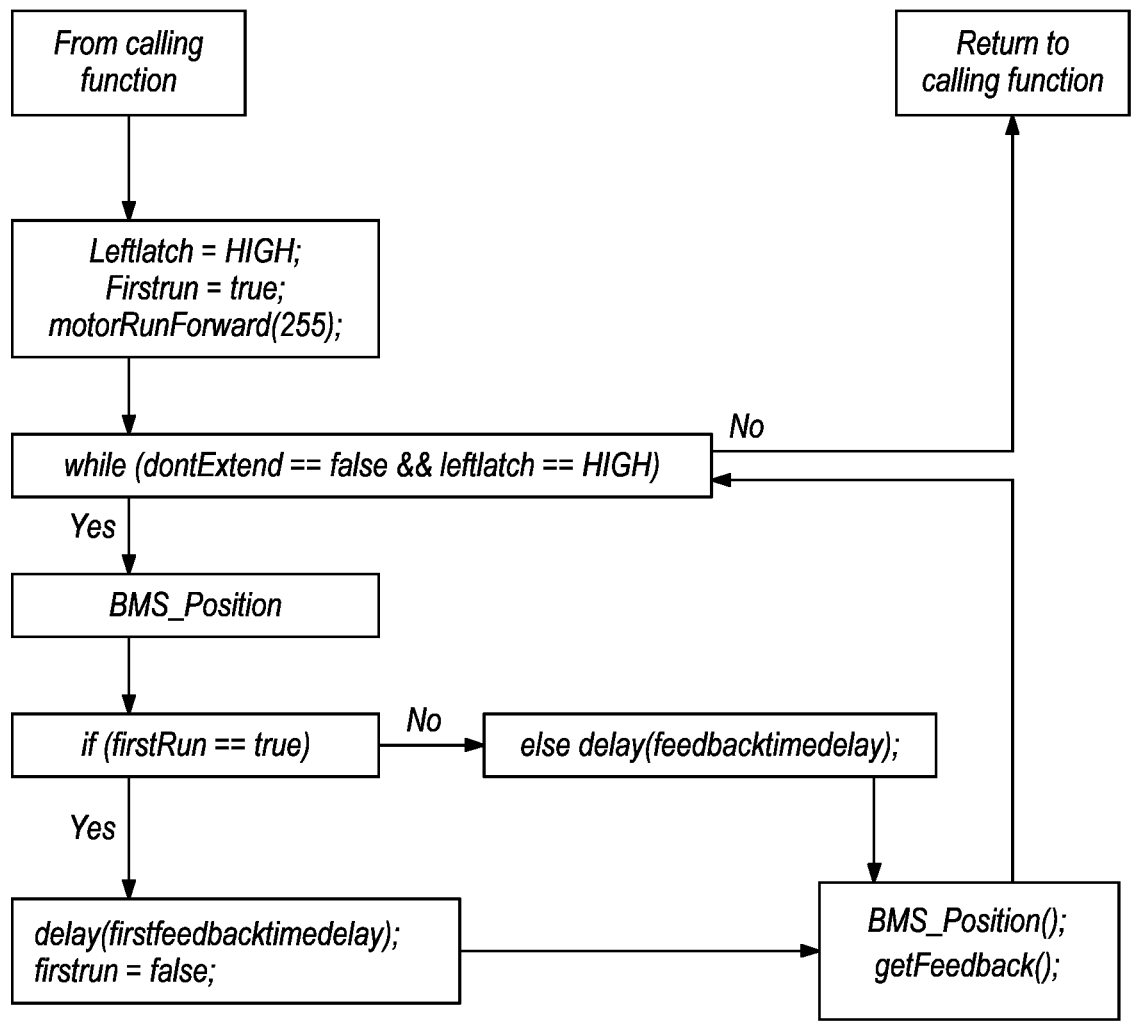

FIG. 21 shows the exemplary execution sequence of the motorForward function. The motorForward cause the actuator to extend.

Figure 22:
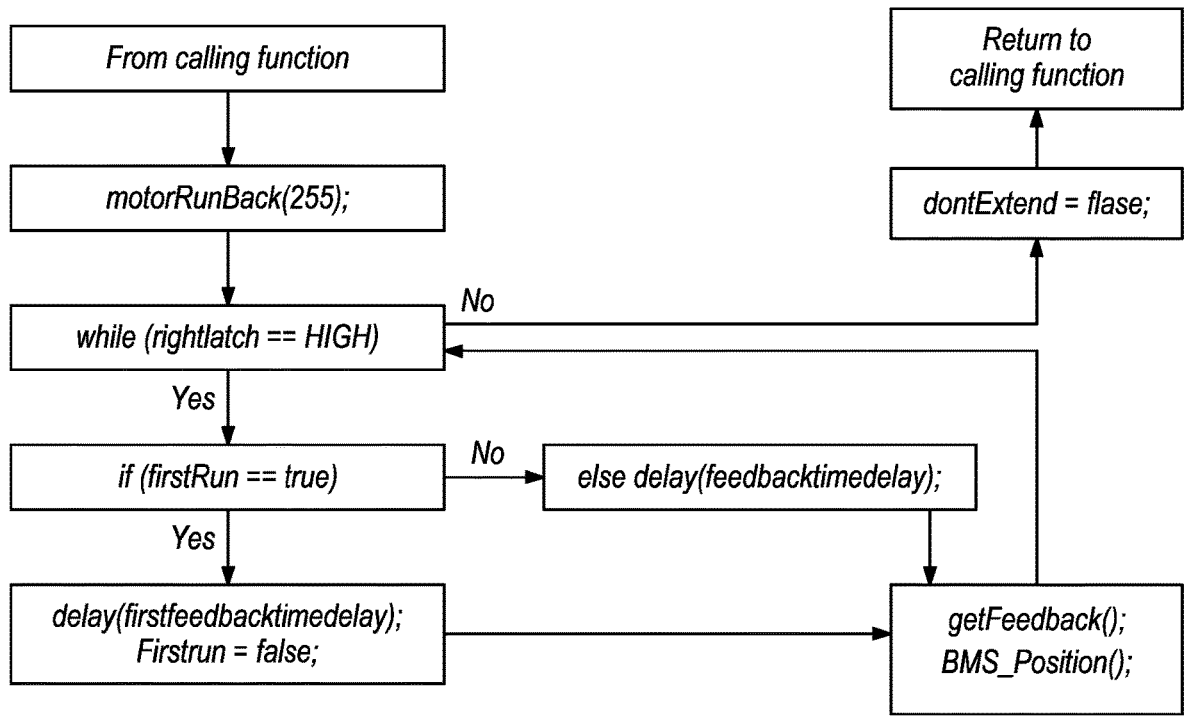

FIG. 22 shows the exemplary execution sequence of the motorBack function. The motorBack function will cause the actuator to retract.

Figure 23:
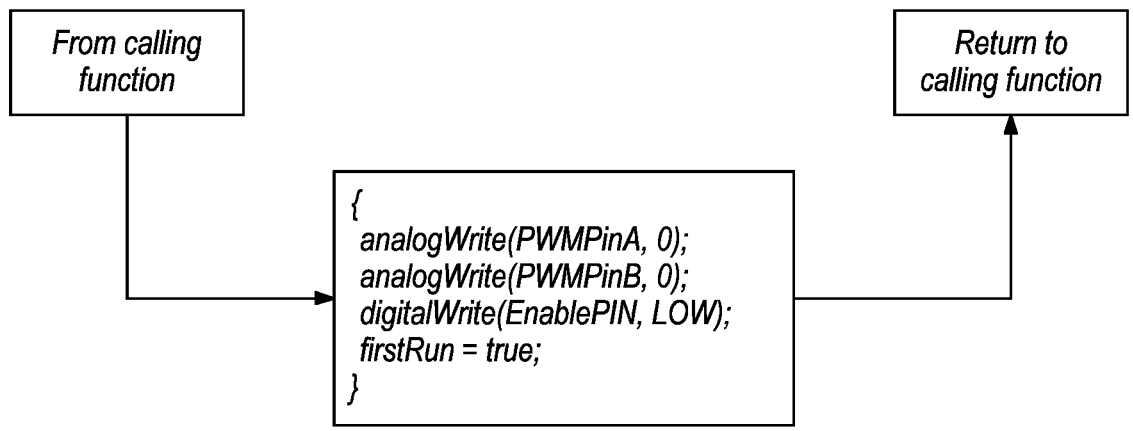

FIG. 23 shows the exemplary execution sequence of the motorStop function. The motorStop function will stop actuator movement.

Figure 24:
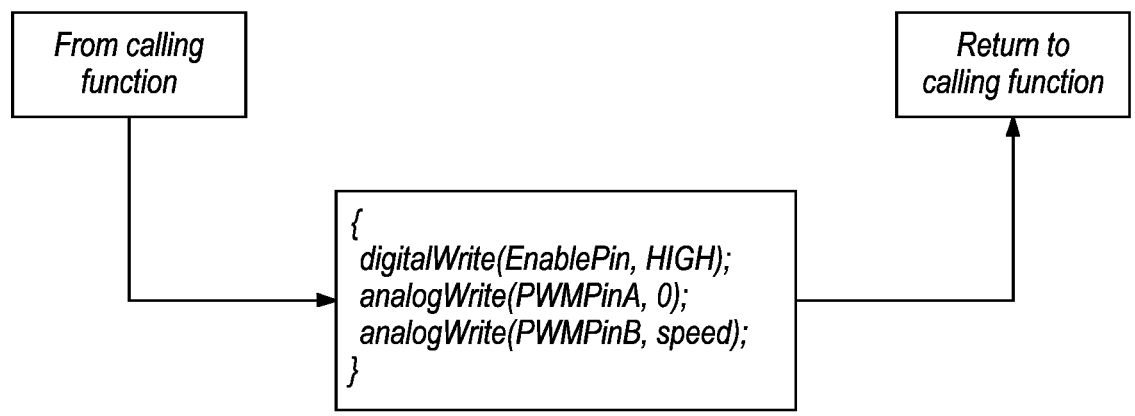

FIG. 24 shows the exemplary execution sequence of the motorRunBack function. The motorRunBack function sets logic state for actuator retraction.

Figure 25:
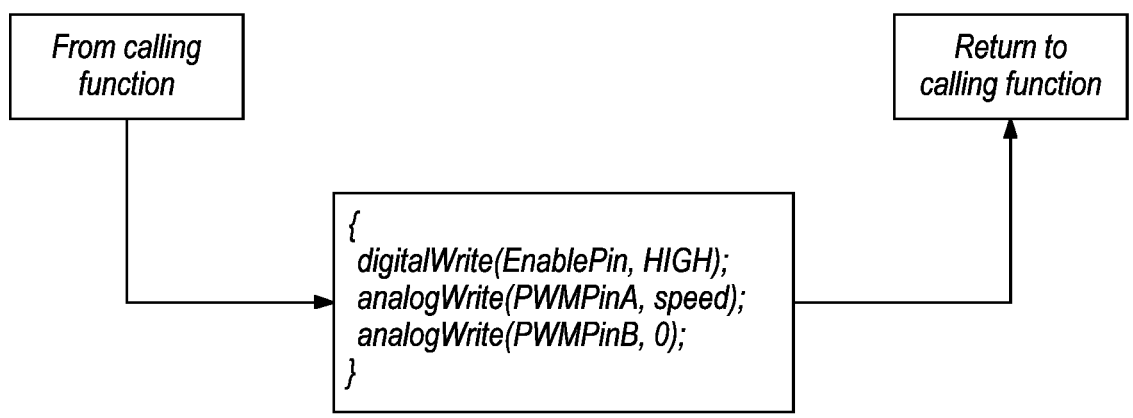

FIG. 25 shows the exemplary execution sequence of the motorRunForward function. The motorRunForward function sets the logic state for actuator extension.

Figure 26:
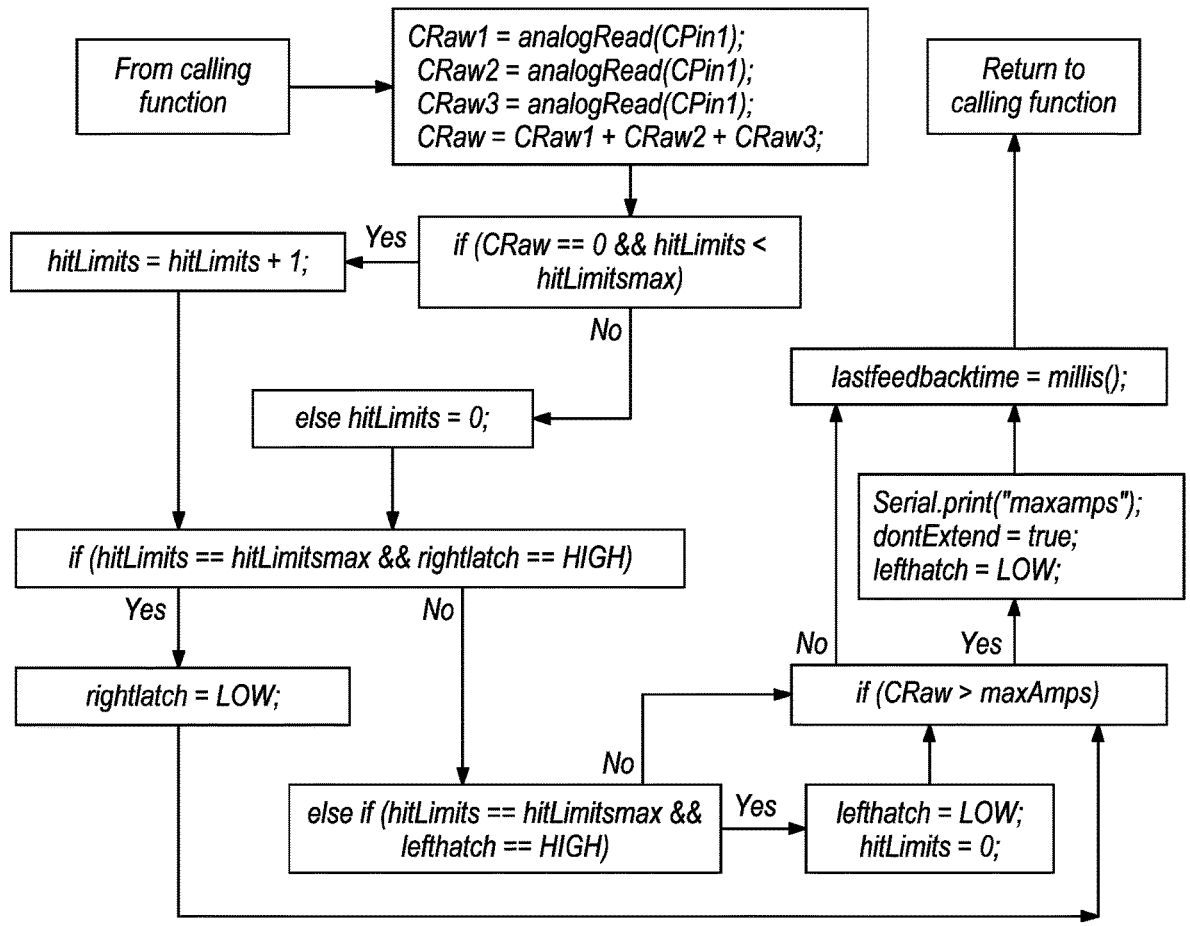

FIG. 26 shows an exemplary execution sequence of the getFeedback function. The getFeedback function is called to both extend and retract the actuator by monitoring the current draw on the actuator controller. When extend or retract limits are met, the actuator controller will set variables that will stop moving the actuator.

Although the invention has been described in detail with reference to certain preferred embodiments, variations and modifications exist within the spirit and scope of the invention as described and defined in the following claims.

The invention claimed is:
1. A magnetic switch test system comprising:
   a base plate;
   a door frame comprises a first side, a second side, and a top side, wherein the door frame is coupled to the base plate;
   a frame connecting plate coupled to the top side of the door frame;
   a magnetic switch disposed between the door frame and the frame connecting plate;
   a door rotatably coupled to the first side of the door frame;
   a door connecting plate coupled to the door;
   an actuator support section coupled to the base plate;
   an actuator coupled to the door on a first end and the actuator support section on a second end; and
   a magnet disposed between the door and the door connecting plate such that the magnet is aligned with the magnetic switch when the door is in a closed position;
   wherein the actuator is configured to open and close the door by extending and retracting.
2. The magnetic switch test system of claim 1, further comprising at least one controller configured to control the actuator.
3. The magnetic switch test system of claim 2, further comprising a potentiometer electrically coupled to the at least one controller, wherein the potentiometer's reading correspond to the position of the actuator.
4. A method of testing magnetic switches comprising:
   providing a test system comprising a door, a door frame, an actuator coupled to the door, a magnet coupled to the door;
   attaching a magnetic switch to the door frame such that the magnet is aligned with the magnetic switch when the door is in a closed position;
   extending or retracting the actuator to open the door until the magnetic switch changes states;
   recording a extension or retraction distance at which the magnetic switch changed states; and
   determining the door displacement distance at which the magnetic switch changed states based on the extension or retraction distance.
5. A method of testing magnetic switches comprising:
   providing a test system comprising:
   a base plate;
   a door frame comprises a first side, a second side, and a top side, wherein the door frame is coupled to the base plate;

a frame connecting plate coupled to the top side of the door frame;
a door rotatably coupled to the first side of the door frame;
a door connecting plate coupled to the door;
an actuator support section coupled to the base plate;
an actuator coupled to the door on a first end and the actuator support section on a second end;
a magnet disposed between the door and the door connecting plate;
at least one controller configured to control the actuator; and
a potentiometer electrically coupled to the at least one controller, wherein the potentiometer's reading correspond to the position of the actuator;
wherein the actuator is configured to open and close the door by extending and retracting;
calibrating the test system, comprising the steps:
(A) attaching a first magnetic switch to the door frame such that the magnet is aligned with the first magnetic switch when the door is in a closed position;
(B) extending or retracting the actuator to open the door a first predetermined distance;
(C) recording a first potentiometer value;
(D) measuring and recording the distance between the door and the door frame; and
(E) repeating steps (B) through (D) with a plurality of potentiometer values and a plurality of predetermined distances;
attaching a second magnetic switch to the door frame such that the magnet is aligned with the second magnetic switch when the door is in a closed position;
extending or retracting the actuator to open the door until the second magnetic switch changes states;
recording a second potentiometer value at which the second magnetic switch changed states; and
determining the door displacement distance at which the second magnetic switch changed states by comparing the second potentiometer value to the plurality of potentiometer values.

* * * * *